(12) United States Patent
Asako et al.

(10) Patent No.: US 10,186,953 B2
(45) Date of Patent: Jan. 22, 2019

(54) SIGNAL TRANSMISSION CIRCUIT PROVIDED WITH LOGIC CIRCUIT

(71) Applicant: DENSO CORPORATION, Kariya, Aichi-pref. (JP)

(72) Inventors: Yosuke Asako, Kariya (JP); Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/497,319

(22) Filed: Apr. 26, 2017

(65) Prior Publication Data

US 2017/0310243 A1 Oct. 26, 2017

(30) Foreign Application Priority Data

Apr. 26, 2016 (JP) .................................. 2016-088515

(51) Int. Cl.
*H02M 1/32* (2007.01)
*H03K 17/18* (2006.01)
(Continued)

(52) U.S. Cl.
CPC .............. *H02M 1/32* (2013.01); *B60L 3/003* (2013.01); *B60L 15/007* (2013.01); *H03K 17/18* (2013.01);
(Continued)

(58) Field of Classification Search
CPC .... H02M 5/4585; H02M 5/458; H02M 5/447; H02M 5/45; H02M 5/4505; H02M 5/005;
(Continued)

(56) References Cited

U.S. PATENT DOCUMENTS 6,005,366 A * 12/1999 Majumdar ............ H02M 7/538
318/801
8,760,095 B2 * 6/2014 Iwaji ...................... H02P 29/02
318/400.17
(Continued)

FOREIGN PATENT DOCUMENTS

JP 2009-060358 A 3/2009
JP 2009-136115 A 6/2009

*Primary Examiner* — Kyle J Moody
*Assistant Examiner* — Kevin H Sprenger
(74) *Attorney, Agent, or Firm* — Oliff PLC

(57) ABSTRACT

A signal transmission circuit transmitting abnormality signals from a primary side circuit to a secondary side circuit is provided, in which the primary side circuit includes switching elements driven by drive circuits, the secondary circuit including a receiving unit receiving the abnormality signals transmitted from the primary side circuit.
The signal transmission circuit includes: a plurality of isolation elements that electrically isolate the primary side circuit and the secondary side circuit, and allows the abnormality signals to be transmitted therethrough; and a logic circuit that receives the abnormality signals from the isolation elements, outputting a predetermined signal indicating an occurrence of an abnormality when at least one of the switching elements shows the abnormality.
The isolation elements transmit the abnormality signals relative to a predetermined reference voltage in the secondary side circuit and the predetermined signal outputted by the logic circuit is received by the receiving unit.

8 Claims, 10 Drawing Sheets

(51) Int. Cl.
- *H03K 17/61* (2006.01)
- *B60L 3/00* (2006.01)
- *B60L 15/00* (2006.01)
- *H02P 27/08* (2006.01)
- *B60L 11/18* (2006.01)
- *H02P 29/024* (2016.01)
- *H02M 7/5387* (2007.01)

(52) U.S. Cl.
CPC .......... *H03K 17/61* (2013.01); *B60L 11/1803* (2013.01); *B60L 2210/40* (2013.01); *B60L 2240/525* (2013.01); *B60L 2240/526* (2013.01); *B60L 2240/527* (2013.01); *B60L 2240/529* (2013.01); *H02M 7/5387* (2013.01); *H02P 27/08* (2013.01); *H02P 29/024* (2013.01)

(58) Field of Classification Search
CPC ............ H02M 1/12; H02M 1/32; H02M 1/38; H02M 1/34; H02M 7/7575; H02M 7/48; H02M 7/51; H02M 7/538; H02M 7/5387; H02M 7/003; H02M 7/53871; H02M 7/53875; H02M 7/53803; H02M 7/537; H02M 3/3376; H02M 3/335; H02M 3/33569; H02M 3/33523; Y02B 70/126; Y02B 70/1491; Y02B 70/1441; H02J 9/063; H02J 9/062; H02J 3/36; H02J 3/382; H02H 7/127; H02H 7/268; H02H 7/1209; H02H 7/122; H02H 7/1227
USPC ... 363/34–37, 51, 55–56.05, 56.12, 131–132
See application file for complete search history.

(56) References Cited

U.S. PATENT DOCUMENTS

| | | | |
|---|---|---|---|
| 2013/0193762 A1* | 8/2013 | Fujii | H02J 1/00 307/64 |
| 2014/0239870 A1* | 8/2014 | Nawa | H02M 7/53871 318/503 |
| 2015/0207425 A1* | 7/2015 | Sasaki | H02M 1/38 363/17 |
| 2016/0234923 A1* | 8/2016 | Tabata | C01B 13/11 |

* cited by examiner

SIGNAL TRANSMISSION CIRCUIT PROVIDED WITH LOGIC CIRCUIT

CROSS-REFERENCE TO RELATED APPLICATION

This application is based on and claims the benefit of priority from earlier Japanese Patent Application No. 2016-88515 filed Apr. 26, 2016, the description of which is incorporated herein by reference.

BACKGROUND OF THE INVENTION

Technical Field

The present disclosure relates to signal transmission circuits adapted for a power system having a plurality of mutually isolated drive circuits each driving a semiconductor switching element.

Description of Related Art

Generally, an inverter that drives an on-vehicle motor is configured of a high voltage system, and a control unit that controls the inverter is configured of low voltage system which is isolated from the high voltage system. In the case where signals are transmitted from the inverter to the control unit, the signals are transmitted from the high voltage system to the low voltage system, the signals including temperature information and abnormality information notifying occurrence of abnormalities in the switching elements of the inverter. Since isolation is required between the high voltage system and the low voltage system, an isolation element is used for transmitting the signals from the inverter to the control unit.

As an example of a related art, for example, JP-A-2009-136115 discloses a technique of using a photo coupler as an isolation element, in which the secondary side circuit of the photo coupler is series-connected, whereby the transmission path from the isolation element to the control unit (receiving unit) are shared by the secondary side circuit. In other words, a single photo coupler is used for circuitry of the control unit. When an abnormality occurs on at least one of the switching elements, a signal indicating an abnormality is transmitted to the control unit. The transmission path is commonly used by the secondary side circuit, whereby the wiring between the control unit and the isolation element can be simplified.

In recent years, magnetic couplers have been used as isolation elements instead of photo couplers. The magnetic coupler outputs, in response to the input signal, a signal relative to a predetermined reference voltage (ground voltage). Hence, the magnetic coupler cannot be used like photo couplers, where the secondary side circuits are serially-connected.

SUMMARY

The present disclosure provides a signal transmission circuit having a plurality of isolation elements outputting a signal relative to a predetermined reference voltage, in which a signal transmission path between the isolation elements and the receiving unit is designed to be common.

The configuration according to the present disclosure provides a signal transmission circuit transmitting abnormality signals from a primary side circuit to a secondary side circuit.

The signal transmission circuit includes: a plurality of isolation elements that electrically isolate the primary side circuit and the secondary side circuit, and allows the abnormality signals to be transmitted therethrough; and a logic circuit that receives the abnormality signals from the isolation elements, the logic circuit being disposed in the secondary circuit, outputting a predetermined signal indicating an occurrence of an abnormality when at least one of the switching elements shows the abnormality.

The primary side circuit including a plurality of switching elements and a plurality of drive circuits that drive the switching elements, the drive circuits each being isolated from each other, the secondary circuit including a receiving unit that receives the abnormality signals corresponding to respective switching elements, transmitted from the primary side circuit.

The isolation elements transmit the abnormality signals relative to a predetermined reference voltage in the secondary side circuit and the predetermined signal outputted by the logic circuit is received by the receiving unit.

According to the configuration, a signal transmission path between a plurality of isolation elements and the receiving unit, through which an abnormality signal is transmitted, can be greatly simplified.

DESCRIPTION OF THE PREFERRED EMBODIMENTS

First Embodiment

Hereinafter, with reference to the drawings, an embodiment of a signal transmission circuit applied to a power system will be described. The signal transmission circuit is used for a hybrid vehicle in the embodiment.

Figure 1:
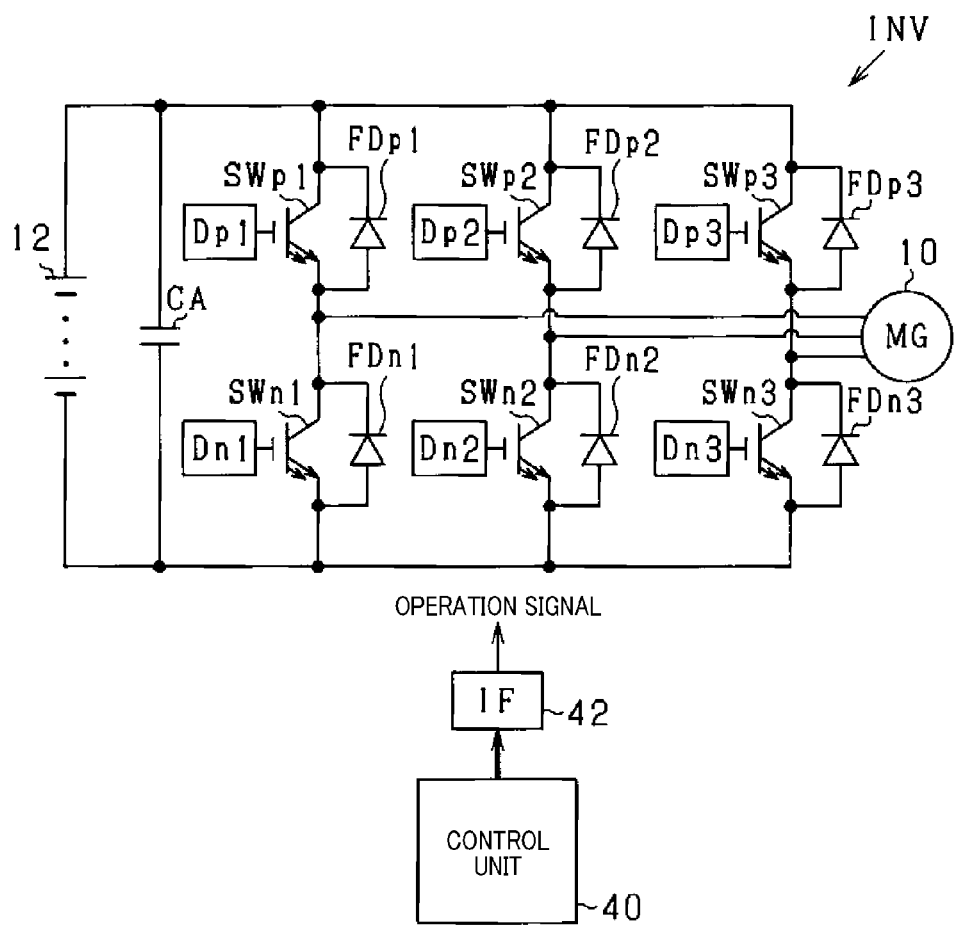
FIG. 1 is an electrical configuration of an inverter.

FIG. 1 is an electrical configuration of a power conversion apparatus according to the first embodiment. A motor generator 10 is mechanically coupled to a drive wheel or an internal combustion engine. The motor generator 10 is connected to an inverter INV. The inverter INV (power conversion circuit) accepts output voltage of a DC (direct current) power source 12 as input voltage, and converts the DC power to AC (alternating current) power. The DC power source 12 is a high voltage battery in which the terminal voltage exceeds 100 Volts. The DC power source may be configured as a step up/down converter.

The inverter INV configured of high voltage side switching elements SWp1 to SWp3 (upper arm switching elements), and low voltage side switching elements SWn1 to SWn3 (lower arm switching element). Each of the high voltage side elements and each of the low voltage side elements are paired to form a series-connected element, and three series-connected elements are connected in parallel to compose the inverter INV. Connection points between each of the switching elements SWp1 to SWp3 and each of the switching elements SWn1 to SWn3 are connected to each phase of the motor generator 10

Each of the high voltage side switching elements SWp1 to SWp3 has a free wheel diode FDpn (n=1, 2, 3) connected between the input terminal and the output terminal (between collector and emitter) of respective switching elements SWp1 to SWp3, such that the cathode and the anode are connected to the collector and the emitter of the switching element respectively.

Similarly, each of the low voltage side switching elements SWn1 to SWn3 has a free wheel diode FDnn (n=1, 2, 3) connected between the input terminal and the output terminal (between collector and emitter) of respective switching elements SWn1 to SWn3, such that the cathode and the anode are connected to the collector and the emitter of the switching element respectively.

The capacitor CA is connected to the collector terminals of the upper arm switches SWp1 to SWp3 (high voltage side terminals) and the emitter terminals of the lower switches SWn1 to SWn3 (low voltage side terminals), serving as a smoothing capacitor that smoothes voltage between both terminals.

The semiconductor switching elements SW (SWp1 to SWp3, SWn1 to SWn3) which configure the above-mentioned inverter INV are power semiconductors. More specifically, the semiconductor switching elements are isolation bipolar transistor (IGBT).

The control unit 4 is configured of a microprocessor, serving as a digital processing means that controls a control amount of the motor generator 10 by operating the inverter INV. Specifically, the control unit 40 outputs operating signals to the switching elements SW of the inverter INV via an interface 42 as an isolation means including magnetic couplers Mp1 to Mp3, and Mn1 to Mn3, thereby operating the inverter INV.

More specifically, the control unit 40 outputs a drive command signal to the drive circuits Dp1 to Dp3 and Dn1 to Dn3 which output a drive command signal to the control terminal (gate) of each switching element via the interface 42. The drive command signal is a PWM (pulse width modulation) signal which is set based on the target value of the output voltage of the inverter INV and the detection value of the inverter INV. The isolation means is provided in the interface 42 to isolate between the high voltage system provided with the inverter INV and the DC power source 12, and the low voltage system provided with the control unit 40. It should be noted that the high voltage system includes a primary side circuit and low voltage system includes a secondary side circuit (described later).

The emitters of the switching elements SWp1 to SWp3 are isolated. Similarly, the emitters of the switching elements SWn1 to SWn3 are isolated. These emitters are connected to different reference voltages. The drive circuits DP1 to Dp3 and the Dn1 to Dn3 are connected to emitters of the switching elements SWp1 to SWp3 and SWn1 to SWn3 to be driven. The drive circuits Dp1 to Dp3 and Dn1 to Dn3 apply voltage to the gates of the switching elements SWp1 to SWp3 and SWn1 to SWn3, using emitter voltages of the switching elements SWp1 to SWp3 and SWn1 to SWn3 as the reference voltage.

Figure 2:
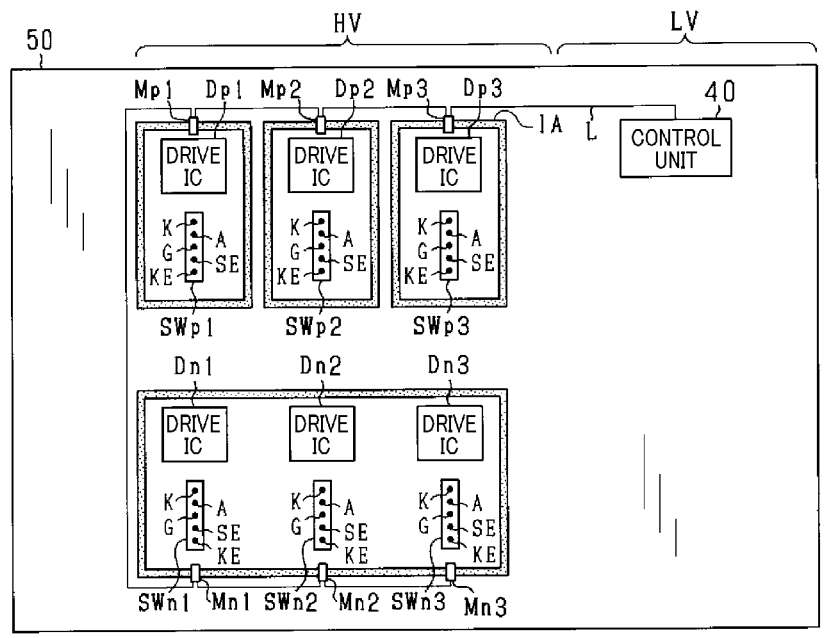
FIG. 2 is an overall diagram showing a circuit substrate on which the inverter is mounted.

FIG. 2 shows a circuit substrate 50 on which the inverter INV according to the inverter INV is mounted. The circuit substrate 50 shown in FIG. 2 includes a high voltage circuit area HV connected to the inverter INV and the low voltage circuit area LV. An area on the right side in FIG. 2 (an opposite direction along which the upper arm switch SWp2 is provided against the upper arm switch SWp3) is defined as low voltage circuit region LV, an area of the center and the left side (an opposite direction along which the upper arm switch SWp2 is provided against the upper arm switch SWp3) is defined as high voltage circuit area HV. It should be noted that components belonging to both the low voltage system and the high voltage system such as magnetic couplers Mp1 to Mp3 and Mn1 to Mn3 are present in the high voltage circuit area HV.

The control unit 40 is disposed in the low voltage circuit area LV in the right side of FIG. 2. An electrolytic capacitor (nor shown) of a fly-back converter that configures the power circuit of the drive circuits Dp1 to Dp3 and Dn1 to Dn3 of the switching elements SW in the inverter INV is disposed in the low voltage circuit area LV as a low voltage system component. Also, a primary winding side circuit of a transformer (not shown) of the fly-back converter that configures the power circuit of the drive circuits Dp1 to Dp3 and Dn1 to Dn3 is disposed in the low voltage circuit area LV as a low voltage system circuit, and the secondary winding side circuit is disposed in the high voltage area HV as a high voltage system circuit.

Figure 3:
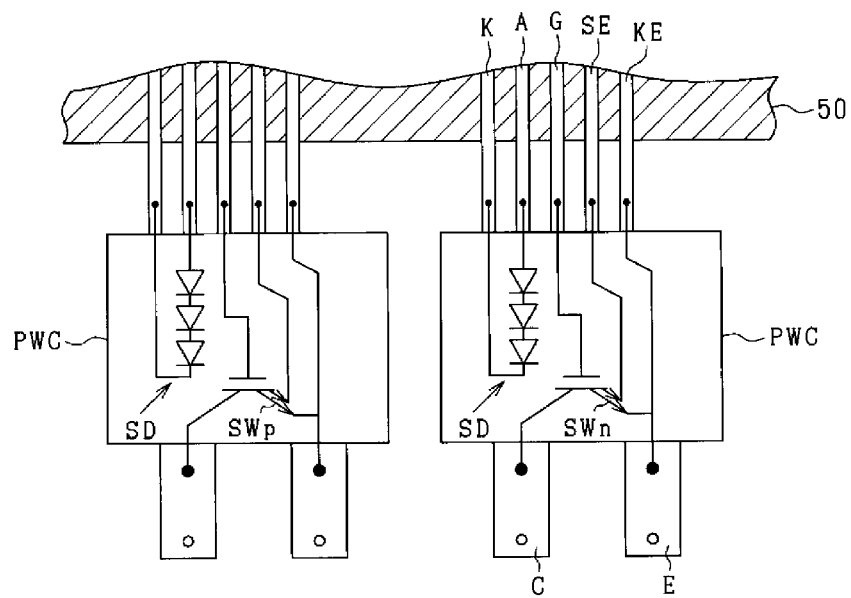
FIG. 3 is an overall configuration of a power card (semiconductor switching element)

As shown in FIG. 3, each switching element SW in the above-described inverter INV is inserted into the circuit substrate 50 from the backside thereof (backside shown in FIG. 2) to make an electrical connection between the switching element SW and the circuit board 50. Each switching element SW is coated by an isolation material and configures a power card PWC (module) together with other components. The power card PWC accommodates a free wheel diode FD and a temperature sensitive diode SD. However, in FIG. 3, illustration of the free wheel diode FD is omitted.

The power card PWC has the same structure for one accommodating the high voltage side switching elements SWp and one accommodating the low voltage side switching elements SWn. The power card PWC has a plurality of signal terminals exposed outside from the isolation material. Specifically, these signal terminals including a gate terminal G, an emitter detection terminal KE, a sense terminal SE of the switching element, and anode A/cathode K terminals of the temperature sensing diode SD are inserted into the circuit substrate 50. The emitter detection terminal KE is connected to the emitter E of the switching element SW, the emitter detection terminal KE having the same voltage as the emitter E. The collector detection terminal KC is connected to the collector of the switching element SW, the collector detection terminal KC having the same voltage as the collector. The sense terminal SE serves as a terminal outputting small current correlated to the current flowing through the switching element SW.

As shown in FIG. 2, since the switching elements SW configure high voltage system, an isolation area IA is provided in the circuit board 50 to isolate these switching elements and other circuit components. The isolation area IA has no circuit components (elements, wiring and power supply pattern).

In upper side in FIG. 2, terminals of the power cards PWC provided with the upper arm switches SWp1 to Swp3 are shown, which are mutually isolated by an isolation area IA. Each of the drive circuits Dp1 to Dp3 which drive the upper arm switches SWp1 to SWp3 is mounted in an area surrounded by the isolation area IA. The reason why these drive circuits Dp1 to Dp3 are isolated is that voltages at KE terminals of the upper arm switches SWp1 to SWp3 significantly vary depending on a state of whether ON or OFF in the respective lower arm switches SWn1 to SWn3. Accordingly, although the operating voltages of the drive circuits Dp1 to Dp3 are small, the drive circuits Dp1 to Dp3 have to be isolated from each other. The width of the above-described isolation area IA is determined considering legal requirement or a view point of preventing isolation breakdown.

The terminals of the power card PWC including the lower arm switches SWn1 to SWn3 are shown in lower side of FIG. 2. Since the voltages of the emitter detection terminals KE corresponding to the lower arm switches SWn1 to SWn3 are close to each other, the isolation area IA is not disposed therebetween. The operating voltage of components related to the drive circuits Dn1 to Dn3 is not so high compared to components disposed in the low voltage circuit area LV. Hence, the isolation area IA is not necessarily provided to the drive circuits Dn1 to Dn3 of the lower arm switches SWn1 to SWn3 on the circuit board 50.

However, reference voltages (emitter voltage of corresponding switches SWn1 to SWn3) of the drive circuits Dn1 to Dn3 are mutually different during the operation of the inverter INV, based on resistance component and inductive component between the emitter terminals of the switches SWn1 to SWn3. Therefore, although the isolation area IA is not provided among the drive circuits Dn1 to DN3, the drive circuits Dn1 to Dn3 are isolated from each other.

Each of the drive circuits Dp1 to Dp3 and Dn1 to Dn3 (hereinafter also referred to as drive circuit D) is connected to the gate terminal G and the emitter detection terminal KE of the respective switching elements SW, and applies voltage to the gate terminal G of the respective switching elements, thereby driving the switching element SW.

Further, the drive circuit D according to the present embodiment is connected to the sense terminal SE of corresponding switching element SW and the anode A and the cathode K of the temperature sensing diode SD. The drive circuit D detects, based on the voltage of the sense terminal SE, current flowing through the switching element SW. The drive circuit D detects, based on the voltage between the anode A and the cathode K, the temperature of the switching element SW. Moreover, the drive circuit D determines, based on the detection value of the temperature of the switching element SW, whether or not an abnormality occurs on the switching element SW. The drive circuit D also determines where or not an abnormality occurs on the drive circuit D itself. Then, the drive circuit D transmits an abnormality signal to the control unit 40, the abnormality signal including abnormality information (i.e., abnormality corresponding to the switching element SW) of the switching element SW and the drive circuit D. It should be noted that a switching element or other ICs can be used to determine abnormality as a main abnormality determination device.

Here, as described above, the drive circuit D and the control unit 40 are connected via the interface 42. Specifically, the drive circuit D and the control unit 40 are connected via the magnetic couplers Mp1 to Mp3 and Mn1 to Mn3 (hereinafter also referred to as magnetic coupler M) which configure the interface 42. The above-described switching elements SWp/n and the drive circuits D belong to the primary side circuit, and the control unit 40 and related logic circuits belongs to the secondary side circuit.

Figure 4:
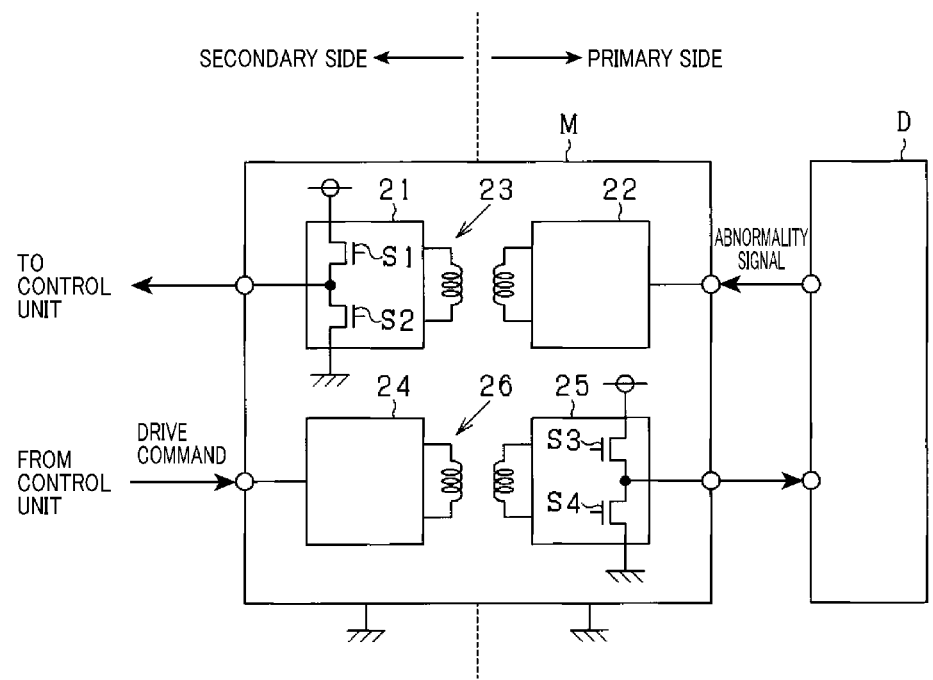
FIG. 4 is a diagram showing an electrical configuration of a magnetic coupler.

As shown in FIG. 4, the magnetic coupler M is provided with an input circuit 22 in the drive circuit D side, an output circuit 21 in the control unit 40 side, and a transformer 23 as an isolation element between the input circuit 22 and the output circuit 21. The input circuit 22 receives an input signal to the magnetic coupler M transmitted from the drive circuit D. The input circuit 22 transmits a pulse signal to the output circuit 21 in accordance with the input signal via the transformer 23. The output circuit 21 transmits, in accordance with the pulse signal transmitted from the input circuit 22, an output signal to the control unit 40 from the magnetic coupler M. The signal transmitted to the input circuit 22 from the drive circuit D is an abnormality signal detected by the drive circuit D.

Further, the magnetic coupler M is provided with an input circuit 24 in the control unit 40 side, an output circuit 25 in the drive circuit D side, and a transformer 26 as an isolation element between the input circuit 24 and the output circuit 25. The input circuit 24 receives an input signal transmitted to the magnetic coupler M from the control unit 40. The input circuit 24 transmits a pulse signal to the output circuit 25 via the transformer 26 in accordance with the input signal. The output circuit 25 transmits an output signal to the drive circuit D from the magnetic coupler M in accordance with the output signal. The signal transmitted from the control unit 40 to the input circuit 24 serves as a drive command signal to the drive circuit D.

The output circuit 21 of the magnetic coupler M drives switches S1 and S2, thereby outputting the signal. The switches S1 and S2 are configured of MOSFETs such that either one switch S1 or switch S2 turns ON when the magnetic coupler is in operation state. When the switch S1 turns ON, the output terminal and the power are conducted so that Hi state signal is outputted from the output terminal. Similarly, when the switch S2 turns ON, the output terminal and the ground are conducted so that Low state signal is outputted from the output terminal. In other words, the magnetic coupler M transmits an output signal depending on the input signal using a binary signal which takes either High or Low with respect to a predetermined reference voltage (ground voltage). Similar to the output circuit 21, the output circuit 25 of the magnetic coupler M drives the switches S3 and S4, thereby outputting a signal.

Figure 5:
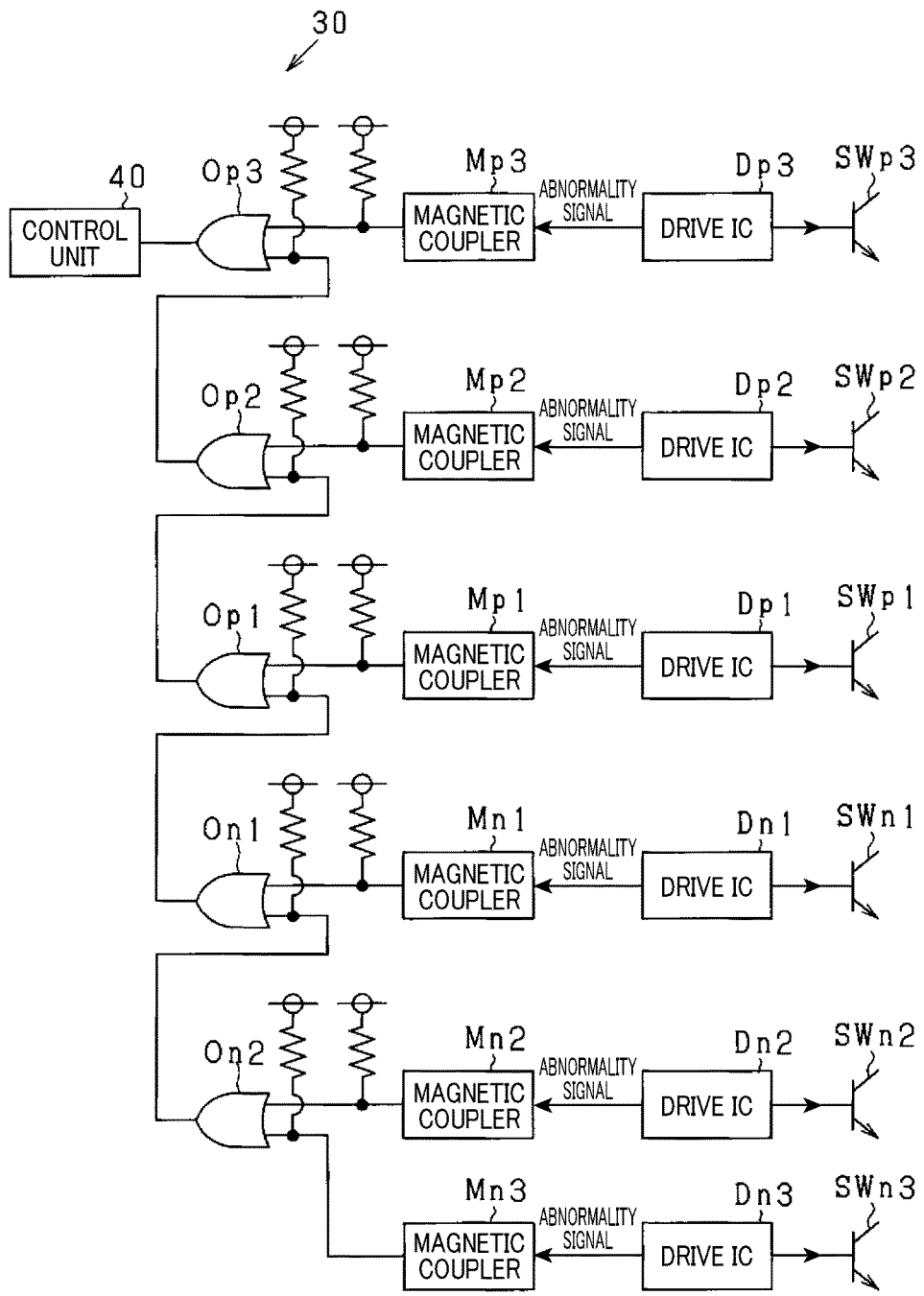
FIG. 5 is a diagram showing a connection between a magnetic coupler and a logic circuit according to a first embodiment.

As shown in FIG. 5, according to the present embodiment, to simplify the circuit configuration, a logic circuit 30 is provided between the magnetic couplers Mp1 to Mp3 and Mn1 to Mn3, and the control unit 40. Here, simplifying circuit configuration includes reducing the number of terminals used for receiving abnormality information, simplifying wirings between the magnetic couplers Mp1 to Mp3 and Mn1 to Mn3, and the control unit 4. When the logic circuit 30 receives an abnormality signal from at least one of the drive circuits Dp1 to Dp3 and Dn1 to Dn3 via the magnetic couplers Mp1 to Mp3, and the Mn1 to Mn3, the logic circuit 30 outputs a predetermined signal indicating an occurrence of an abnormality in the whole system to the control unit 40.

Each of the magnetic couplers Mp1 to MP3 and Mn1 to Mn3 according to the present embodiment outputs High state signal at the secondary side (control unit 40 side) when an abnormality signal indicating an occurrence of an abnormality is received from corresponding primary side drive circuit Dp1 to Dp3 and Dn1 to Dn3 (primary side circuit). The logic circuit 30 is configured of OR circuits. Hence, when an abnormality signal is received from at least one of the magnetic couplers Mp1 to Mp3 and Mn1 to Mn3, the logic circuit 30 outputs, by using the OR circuit, a High state signal to the control unit 40.

In other words, the logic circuit 30 performs logical OR of all magnetic couplers Mp1 to Mp3 and Mn1 to Mn3, and outputs the result to the control unit 40. Accordingly, a predetermined signal indicating an occurrence of abnormality as a whole system is outputted to the control unit 40. According to the configuration, a transmission path can be commonly used for a plurality of magnetic couplers Mp1 to Mp3 and Mn1 to Mn3 to transmit an abnormality signal to the control unit 40.

The logic circuit 30 connects adjacent magnetic couplers Mp 1 to Mp3 and Mn1 to Mn3 to be in serial (serial connection). As shown in FIG. 2, the magnetic coupler Mn3 and the magnetic coupler Mn2 are adjacently located, the magnetic coupler Mn2 and the magnetic coupler Mn1 are adjacently located, and the magnetic coupler Mn1 and the magnetic coupler Mp1 are adjacently located, and the magnetic coupler Mp2 and the magnetic coupler Mp3 are adjacently located.

The logic circuit 30 is provided with an OR circuit On2 to which the output of the magnetic coupler Mn3 and the output of the magnetic coupler Mn2 are connected to the inputs of the OR circuit Ont. Also, the logic circuit 30 is provided with an OR circuit On1 to which the output of the OR circuit On2 and the output of the magnetic coupler Mn1 are connected to the inputs of the OR circuit On1. Moreover, the logic circuit 30 is provided with an OR circuit Op1 to which the output of the OR circuit On1 and the output of the magnetic coupler Mp1 are connected to the inputs of the OR circuit Op1. Further, the logic circuit 30 is provided with an OR circuit Opt to which the output of the OR circuit Op1 and the output of the magnetic coupler Mp2 are connected to the inputs of the OR circuit Opt. Furthermore, the logic circuit 30 is provided with an OR circuit Op3 to which the output of the OR circuit Opt and the output of the magnetic coupler Mp3 are connected to the inputs of the OR circuit Op3.

The OR circuits Op1 to Op3 and On1 correspond to "first logic circuit" to which corresponding one output among the magnetic couplers Mp1 to Mp3 and Mn1 is connected and correspond one output of adjacent OR circuit Op1, Op2, On1 and On2 is connected. The OR circuit Op3 corresponds to "second logic circuit" in which the output is connected to the control unit 40. The output signal of the OR circuit Op3 is outputted to the control unit 40 as an output signal of the logic circuit 30. The OR circuit On2 corresponds to third logic circuit to which two outputs of corresponding magnetic couplers Mn2 and Mn3 are connected.

According to the configuration, as described above, the OR circuits OP1 to Op3, On1 and On2 are provided such that adjacent magnetic couplers Mp1 to Mp3 and Mn1 to Mn3 are serially connected. Thus, wirings among the magnetic couplers Mp1 to Mp3 and Mn1 to Mn3, the logic circuit 30 and the control unit 40 can be simplified.

As shown in FIG. 2, the magnetic coupler Mp3 is located to have the shortest distance to the control unit 40, in which the magnetic coupler Mp3 corresponds to the OR circuit Op3 as the "second logic circuit" connected to the control unit 40 at the output of the second logic circuit, among the OR circuit Op1 to Op3 and On1 and On2. Therefore, the length of the wiring L between the magnetic couplers Mp1 to Mp3, Mn1 and Mn3, the logic circuit 30, and the control unit 40 can be shorter. Thus, the control unit 40 can detect abnormality faster in the drive circuits Dp1 to Dp3 and Dn1 to Dn3.

Further, the magnetic couplers Mp1 to MP3 and Mn1 to Mn3 continues to output a Low signal, when an abnormality signal indicating an occurrence of abnormality from the drive circuits Dp1 to Dp3 and Dn1 to Dn3, that is, none of drive circuits Dp1 to Dp3 and Dn1 to Dn3 detects abnormality. The OR circuits Op1 to Op3 and On1 to On2 are pulled up via resistors at the input circuits thereof. Hence, when no abnormality is detected in the whole system, Low signals are inputted to the OR circuits Op1 to Op3 and On1 and On2, and the logic circuit 30 (OR circuit Op3) outputs a Low signal indicating that the whole system is in a normal state.

According to this configuration, in the case where an open failure occurs in the connection between the magnetic couplers Mp1 to Mp3, Mn1 and Mn2, and the OR circuits Op1 to Op3, On1 and On2, any one of inputs of the OR circuits Op1 to Op3, On1 and On2 becomes High. Hence, the logic circuit 30 outputs a High signal indicating an occurrence of abnormality in the whole system. Also, when an open failure occurs due to wire-breakage or the like in the connection among the OR circuits Op1 to Op3, On1 and On2, any one of inputs of the OR circuits Op1 to Op3, and On1 becomes High. Thus, the logic circuit 30 outputs High signal indicating an occurrence of abnormality as the whole system.

Thus, according to the present embodiment, an open failure in a connection between the magnetic couplers Mp1 to Mp3 and Mn1 to Mn3, and the OR circuits Op1 to Op3 and On1 and On2, and an open failure in a connection between the OR circuits Op1 to Op3 and On1 and ON2 can be detected as an abnormality of the whole system.

In the case where an abnormality of the magnetic coupler Mp1 to Mp3, and Mn1 to Mn3 causes operation of the magnetic couplers Mp1 to Mp3, and Mn1 to Mn3, to stop, any one of inputs of the OR circuits Op1 to Op3 and On1 and On2 becomes High. Hence, the logic circuit 30 outputs High signal indicating an occurrence of an abnormality as the whole system. In other words, according to the configuration, abnormality in the magnetic couplers Mp1 to Mp3 and Mn1 to Mn3 can be detected as an abnormality as the whole system.

According to the present embodiment, "isolation element" is a magnetically-coupled type isolation element, specifically a magnetic coupler. According to the present embodiment, even in a magnetic coupler that outputs a binary signal either High or Low with respect to a predetermined reference voltage, a transmission path to the control unit 40 as a "receiving unit" can be commonly used (shared transmission path).

Second Embodiment

The magnetic couplers Mp1 to Mp3 and Mn1 to Mn3 according to the second embodiment outputs Low signal, when an abnormality signal is transmitted from the drive circuits Dp1 to Dp3 and Dn1 to Dn3. Further, the logic circuit 30A of the second embodiment outputs Low signal to the control unit 40 by using an AND circuit, when an abnormality signal is transmitted from at least one of the magnetic couplers Mp1 to Mp3 and Mn1 to Mn3.

Figure 6:
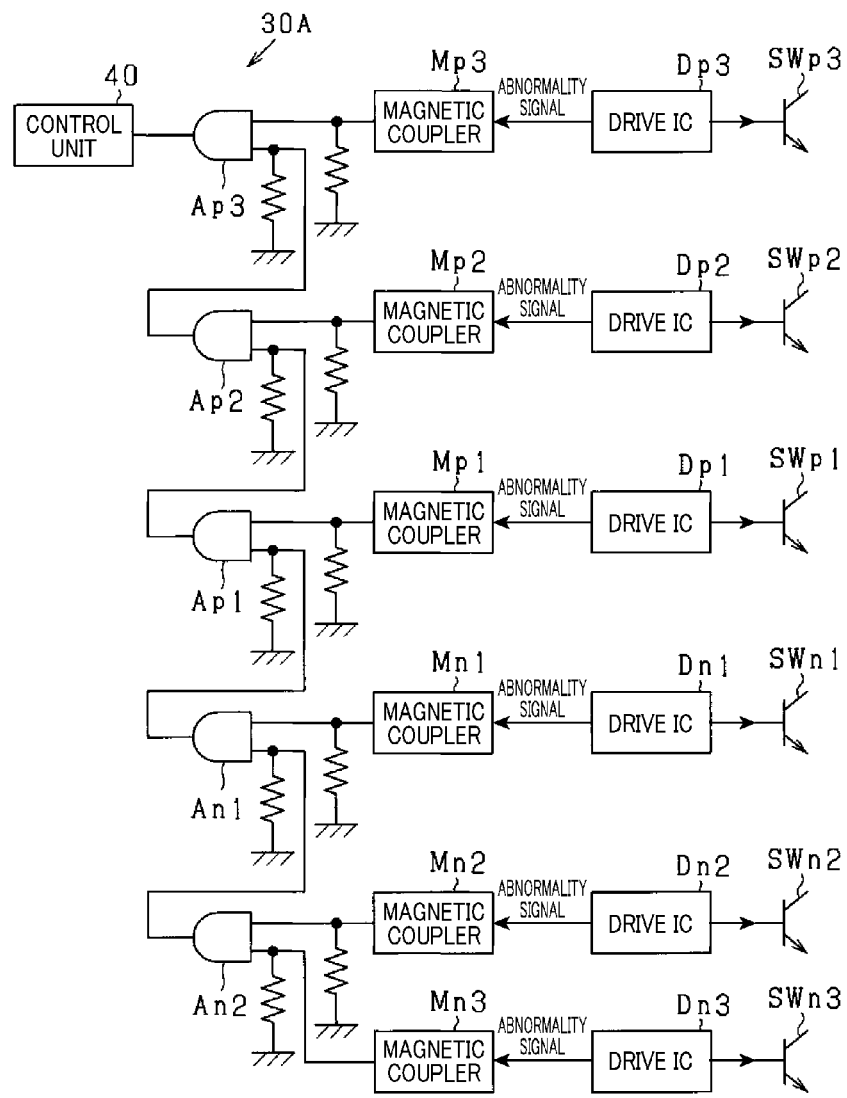
FIG. 6 is a diagram showing a connection between a magnetic coupler and a logic circuit according to a second embodiment.

A configuration of the second embodiment is shown in FIG. 6. The logic circuit 30A receives output signals Mn3 and Mn2 at the inputs of the AND circuits An2. Also, the output of the AND circuit An2 and the output of the magnetic coupler Mn1 are connected to the AND circuit An1. The output of the AND circuit An1 and the output of the magnetic coupler Mp1 are connected to the AND circuit Ap1. The output of the AND circuit Ap1 and the output of the magnetic couplet Mpg are connected to the AND circuit Ap2. The output of the AND circuit Ap2 and the output of the magnetic coupler Mp3 are connected to the AND circuit Ap3. The output signal of the AND circuit Ap3 as the output signal of the logic circuit 30A is connected to the control unit 40.

In the configuration shown in FIG. 6 in which the logic circuit 30A includes AND circuits Ap1 to Ap3, An1 and An2, the inputs of the AND circuits Ap1 to Ap3, An1 and An2 are pulled down. The magnetic couplers Mp1 to Mp3, Mn1 to Mn3 continue to output a High level signal when none of the drive circuits Dp1 to Dp3 and Dn1 to Dn3 detects any abnormalities.

According to the above-described configuration, when an open failure occurs in the connection between the magnetic couplers MP1 to Mp3, Mn1 to Mn3, and the AND circuits Ap1 to Ap3, An1, An2, a Low level signal representing an occurrence of abnormality as the whole system is outputted to the control unit 40. Similarly, when an open failure occurs in the connection among the AND circuits Ap1 to Ap3, An1 and An2, a Low level signal representing an occurrence of abnormality as the whole system is outputted to the control unit 40. When an operation of the magnetic couplers Mp1 to Mp3 and Mn1 to Mn3 is stopped, a Low level signal representing an occurrence of abnormality as the whole system is outputted to the control unit 40.

According to the above-described configuration, an open failure of a connection between the magnetic couplers Mp1 to Mp3, Mn1 to Mn3 and the AND circuits Ap1 to Ap3, An1 and An2, and an open failure among the AND circuits Ap1 to Ap3, An1 and An2 can be detected as an abnormality in the whole system.

Third Embodiment

Figure 7:
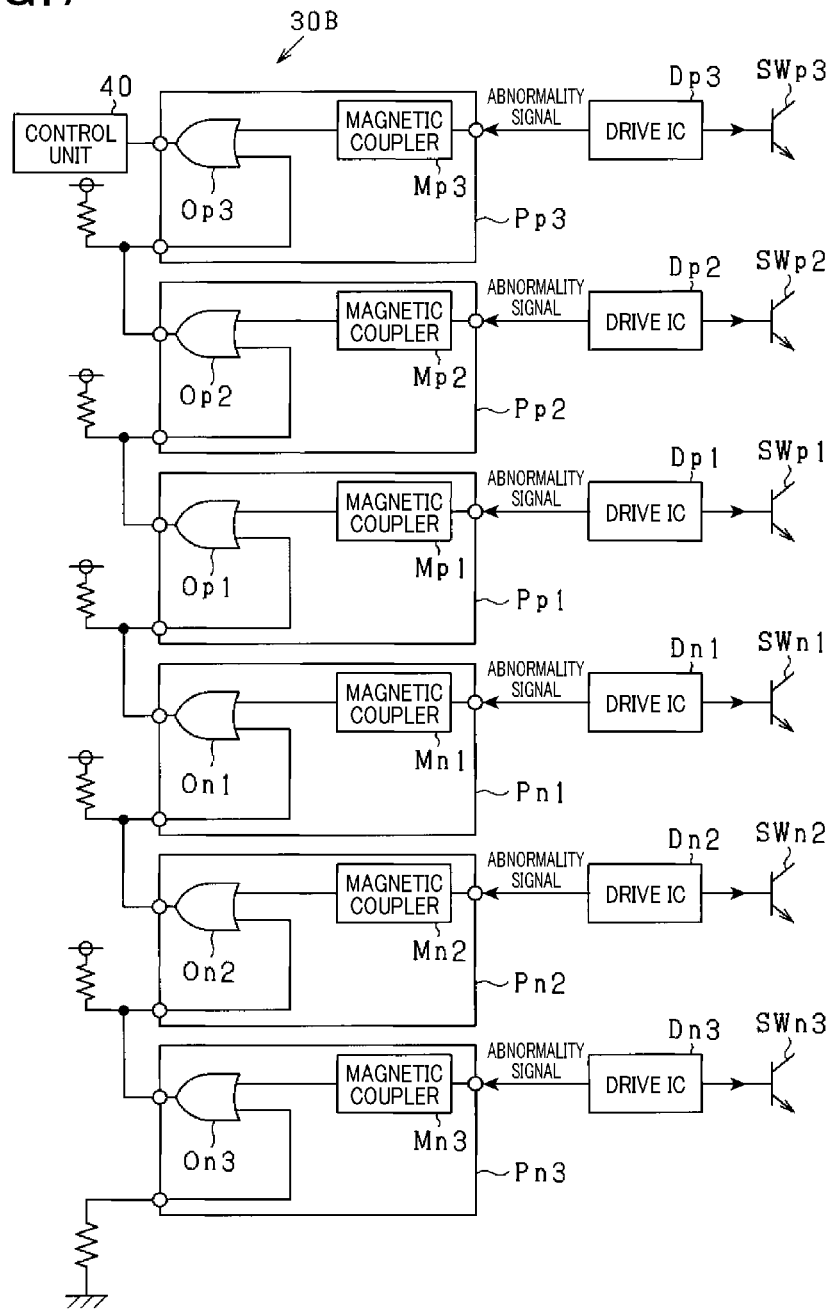
FIG. 7 is a diagram showing a connection between a magnetic coupler and a logic circuit according to a third embodiment.

A configuration of the third embodiment is shown in FIG. 7. Comparing with the first embodiment shown in FIG. 5, the logic circuit 30B of the present embodiment includes an OR circuit On3 as "fourth logic circuit". The OR circuit On3 accepts the output of the magnetic coupler Mn3 and the ground voltage at the input thereof. The output of OR circuit On3 is connected to the input of the OR circuit Ont. Thus, the OR circuit On3 passes the output of the magnetic coupler Mn3 to the OR circuit On2 without any changes.

According to the third embodiment, the OR circuits Op1 to Op3 and On1 to On3 are provided corresponding to the magnetic couplers Mp1 to Mp3 and Mn1 to Mn3 respectively. In this respect, the magnetic couplers Mp1 to Mp3 and Mn1 to Mn3, and corresponding OR circuits Op1 to Op3 and On1 to On3 are provided in a single module. The module is sealed by resin or the like. The module includes one magnetic coupler and a plurality of elements including the OR circuits corresponding to the magnetic coupler M, and wirings that connects these elements.

According to the third embodiment, the magnetic couplers Mp1 to Mp3 and Mn1 to Mn3, and corresponding OR circuits Op1 to Op3 and On1 to On4 are sealed to form modules Pp1 to Pp3, and Pn1 to Pn3 having the same configuration. In other words, since the configuration is common in the modules Pp1 to Pp3, and Pn1 to Pn3, the same device can be used for the modules Pp1 to Pp3 and Pn1 to Pn3 so that manufacturing cost can be reduced.

Similar to the third embodiment, in the configuration of the second embodiment, the AND circuit An3 may be provided corresponding to the magnetic coupler Mn3, and the magnetic couplers Mp1 to Mp3 and Mn1 to Mn3 and corresponding AND circuits Ap1 to Ap3 and An1 to An3 may compose a module. In the inputs of the AND circuit An3, a terminal to which the magnetic couple Mn3 is not connected may be pulled up. According to the present configuration, similar effects to the third embodiment can be obtained.

Fourth Embodiment

Figure 8:
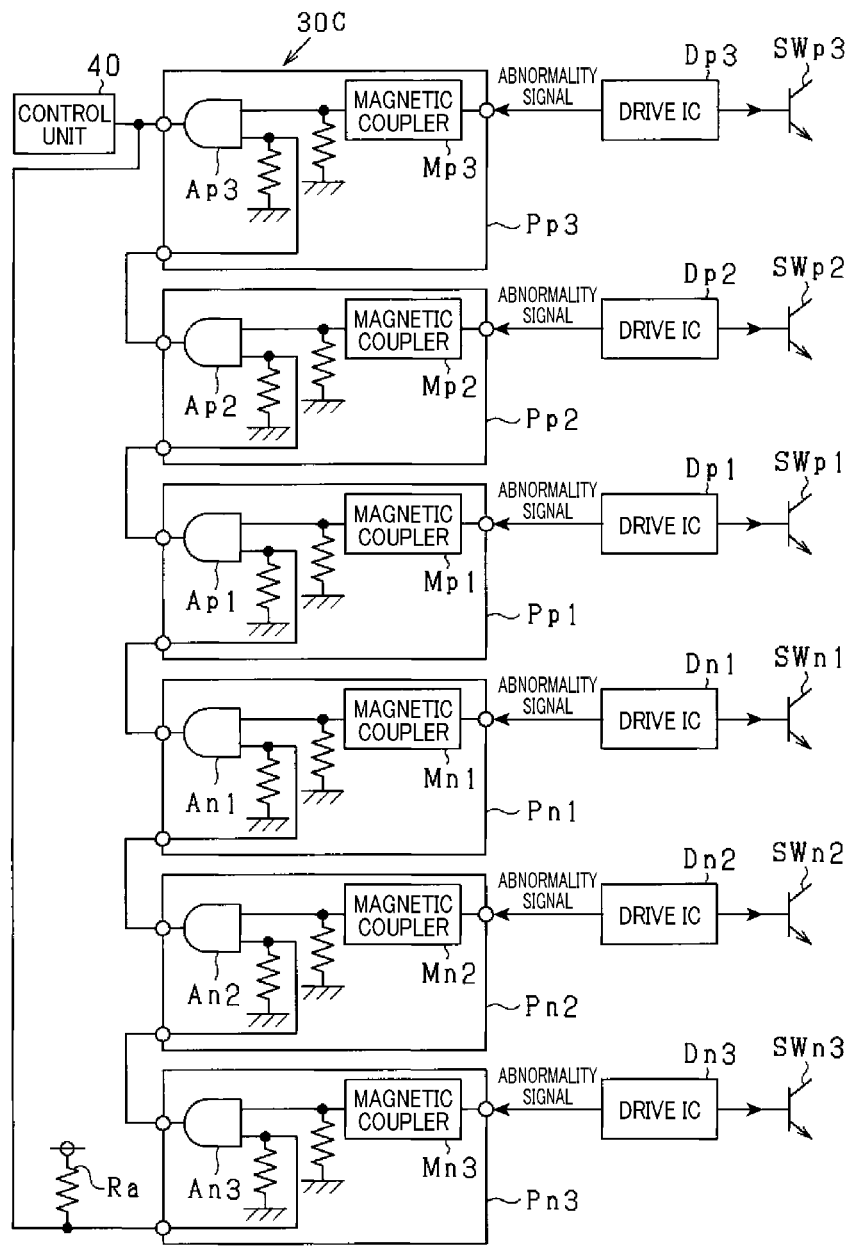
FIG. 8 is a diagram showing a connection between a magnetic coupler and a logic circuit according to a fourth embodiment.

The configuration of the fourth embodiment is shown in FIG. 8. Similar to the configuration of the second embodiment shown in FIG. 6, the logic circuit 30C according to the fourth embodiment includes a AND circuit. Further, an AND circuit An3 as the "fourth logic element" is provided.

Similar to the third embodiment, the magnetic couplers Mp1 to Mp3 and Mn1 to Mn3 and corresponding AND circuits Ap1 to Ap3 and An1 to An3 are formed in the modules. According to the configuration of the present embodiment, pull-down resistors which pull-down the inputs of the AND circuits Ap1 to Ap3 and An1 to An3 are integrated into the modules Pp1 to Pp3 and Pn1 to Pn3.

According to the present embodiment, the AND circuit An3 accepts, at the inputs thereof, the output of the magnetic coupler Mn3 and the output of the AND circuit Ap3 (logical circuit 30C). Specifically, the input terminal of the AND circuit An3 is pulled up with a resistor Ra outside the module Pn3 and connected to the output of the AND circuit Ap3. The resistance of the pull-up resistor Ra that pulls-up the input of the module Pn3 outside the module Pn3 is set to be smaller than the resistance of the pull-down resistor integrated in the module Pn. Thus, the configuration of the module Pn3 is commonly used for the modules Pp1 to Pp3 and Pn1 and Pn2, and inputs of the module Pn3 (AND circuit An3) are pulled up.

When an abnormality as the whole system occurs, the output of the logic circuit 30C turns to Low, and the AND circuit An3 receives the Low signal at the input thereof. When the output of the logic circuit 30C is not Low (high or floating), High signal is outputted to the OR circuit On3. According to this configuration, when an abnormality occurs as the whole system, the outputs of all AND circuits Ap1 to Ap3 and An1 to An3 become Low.

Figure 9:
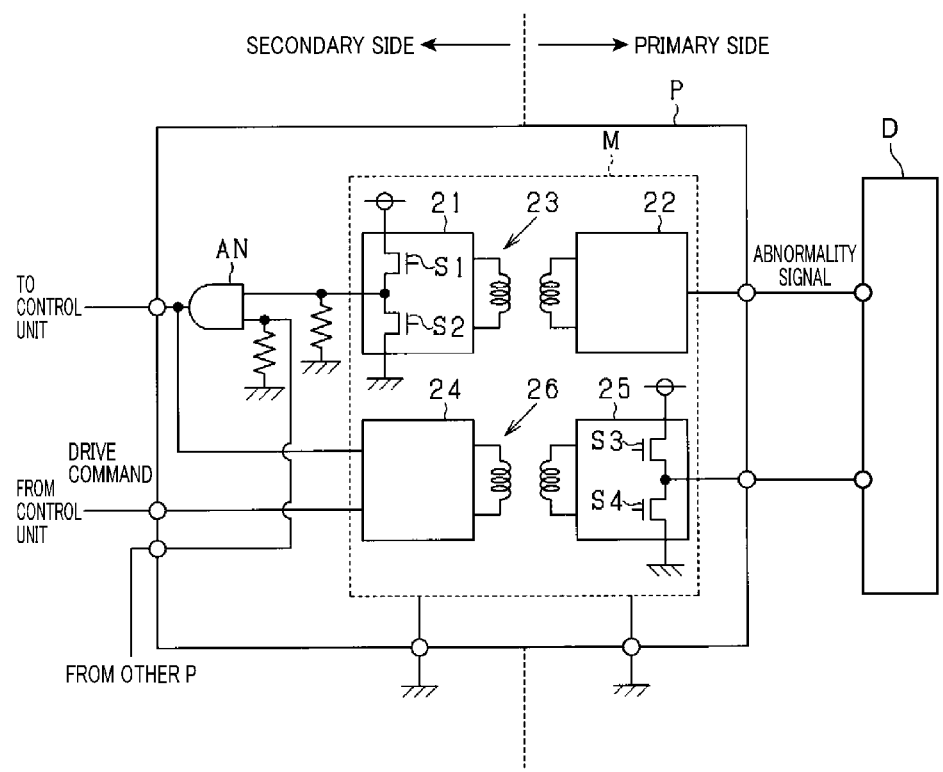
FIG. 9 is a diagram showing an electrical configuration of a module according to the fourth embodiment.

Also, as shown in FIG. 9, the magnetic coupler M (magnetic couplers Mp1 to Mp3 and Mn1 to Mn3) according to the present embodiment transmits an abnormality signal indicating an abnormality detected by the drive circuit D to the control unit 40 from the drive circuit D, and transmits a drive command signal commanding the drive circuit D to drive the switch SW from the control unit 40.

As shown in FIG. 9, the input circuit 24 of the magnetic coupler M according to the present embodiment receives an output of the AND circuit AN. As described above, when an abnormality as the whole system occurs, the outputs of all AND circuits become Low. When receiving Low signal from the AND circuit AN, the input circuit 24 stops outputting the pulse signal to the transformer 26 regardless of the drive command signal transmitted from the control unit 40.

The configuration of the input circuit 24, in which the output signal of the AND circuit AN and the drive command signal are received, may be changed to a configuration in which the output signal of the AND circuit AN and the drive command signal are outputted to an AND circuit, and the output of the AND circuit is outputted to the input circuit 24.

According to the present embodiment, when an abnormality occurs on any one of the drive circuits Dp1 to Dp3 and Dn1 to Dn3, the output signals of all of the AND circuits show an occurrence of an abnormality. The magnetic couplers Mp1 to Mp3 and Mn1 to Mn3 stop transmitting, in response to the AND circuits Ap1 to Ap3 and An1 to An3, the drive command signal to corresponding drive circuit in Dp1 to Dp3 and Dn1. to Dn3. According to the configuration, without using the control unit 40, the output of the inverter INV can be stopped, when an abnormality occurs in at least one of drive circuits Dp1 to Dp3 and Dn1 to Dn3.

According to the present embodiment, similar to the second embodiment, the magnetic couplers Mp1 to Mp and Mn1 to Mn3, and the AND circuits Ap1 to Ap3 and An1 to An3 are sealed to form modules Pp1 to Pp3, and Pn1 to Pn3. In other words, configuration of the modules Pp1 to Pp3 and Pn1 to Pn3 are commonly used so that the same device can be used for the modules Pp1 to Pp3 and Pn1 to Pn3. As a result, manufacturing cost can be reduced.

Similar to the forth embodiment, the configuration of the third embodiment may be changed such that the output signal of the logic circuit 30 is connected to the input of the OR circuit On3. In this case, the output of the magnetic coupler Mn3 and the output of the logic circuit 30B (OR circuit Op3) are connected to the OR circuit On3. Specifically, when the output signal of the logic circuit 30B is High, a High state signal is outputted to the OR circuit On3, and a Low state signal is outputted to the OR circuit On3 when the logic circuit 30B is a state other than High (i.e., Low state or floating state).

Fifth Embodiment

Figure 10:
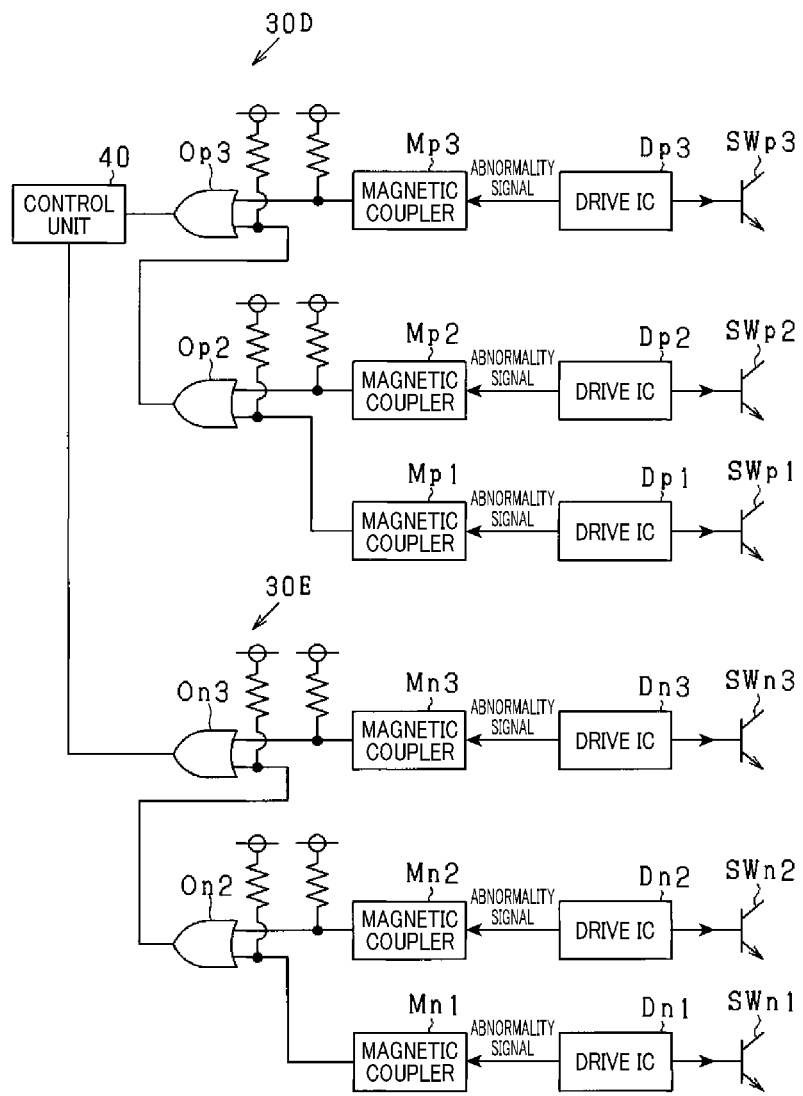
FIG. 10 is a diagram showing a connection between a magnetic coupler and a logic circuit.

A configuration of the fifth embodiment is shown in FIG. 10. According to the present embodiment, the magnetic couplers Mp1 to Mp3 are connected in series by the first logic circuit 30D configured of the OR circuit Op1 and Op2, and the magnetic couplers Mn1 to Mn3 are connected in series by the second logic circuit 30E configured of the OR circuit On1 and On2. Each of the outputs of the logic circuits 30D and 30E is connected to the control unit 40.

In other words, the first logic circuit 30D accepts abnormality signals from the magnetic couplers Mp1 to Mp3 corresponding to the upper arm switches SWp1 to SWp3. Then, when an abnormality is detected on at least one of the drive circuits Dp1 to Dp3 corresponding to the upper arm switches SWp1 to SWp3, the first logic circuit 30D outputs an abnormality signal indicating an occurrence of abnormality as the whole system including the upper arm switches SWp1 to SWp3 and the drive circuits Dp1 to DP3 to the control unit 40.

Similarly, the second logic circuit 30E accepts abnormality signals from the magnetic couplers Mn1 to Mp3 corresponding to the lower arm switches SWn1 to SWn3. Then, when an abnormality is detected on at least one of the drive circuits Dn1 to Dn3 corresponding to the lower arm switches SWn1 to SWn3, the second logic circuit 30E outputs an abnormality signal indicating an occurrence of abnormality as the whole system including the lower arm switches SWn1 to SWn3 and the drive circuits Dn1 to Dn3 to the control unit 40.

Figure 11:
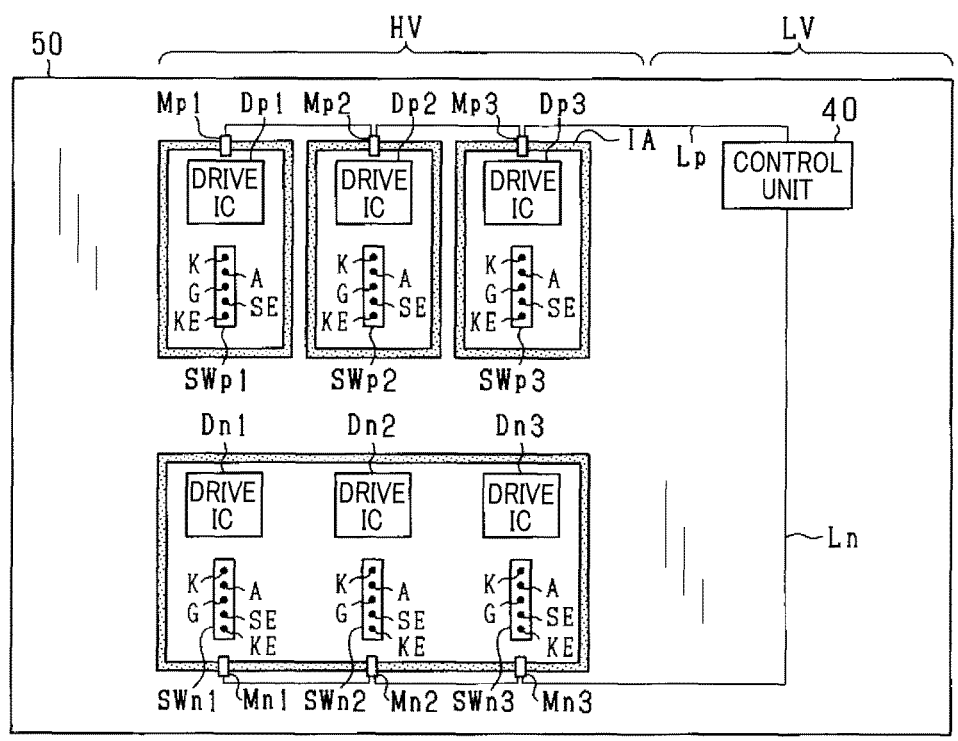
FIG. 11 is a diagram showing wirings connected between magnetic couplers and a control unit.

FIG. 11 shows a wiring Ln which connects the magnetic couplers Mn1 to Mn3, and a wiring Lp which connects the magnetic couplers Mp1 to Mp3, according to the present embodiment.

According to the present embodiment, the control unit 40 acquires each of the abnormality signals separately from the drive circuits Dp1 to DP3 of the upper arm switches SWp1 to SWp3 and the drive circuits Dn1 to DN3 of the lower arm switches SWn1 to SWn3, whereby the control unit 40 can acquire an occurrence of abnormality faster in the drive circuits Dp1 to Dp3, and Dn1 to Dn3. Also, when the drive circuits Dp1 to DP3 corresponding to the upper arm switches SWp1 to SWp3 detect an abnormality, for example, by controlling the lower arm switches SWn1 to SWn3, power stored in the inverter INV can be discharged. When the drive circuits Dn1 to Dn3 corresponding to the lower arm switches SWn1 to SWn3 detect an abnormality, by controlling the upper arm switches SWp1 to SWp3, power stored in the inverter INV can be discharged.

Other Embodiment

The pull-up resistors of the input terminals of the OR circuits Op1 to Op3, On1 and On2 may be omitted. In a configuration in which the input side pull-up resistors are omitted, when the drive circuits Dp1 to Dp3 and Dn1 to Dn3 do not detect any abnormalities, Low level signal may not be outputted continuously.

In the configuration according to the first embodiment, instead of the OR circuits Op1 to Op3 and On1 to On3, NOR circuit may be used. In this case, each output of the respective NOR circuits may be inverted and outputted to adjacent NOR circuit. Similarly, in the configuration of the second embodiment, instead of the AND circuit, NAND circuit may be used. In this case, each output of the respective NAND circuits may be inverted and outputted to an adjacent NAND circuit.

According to the above-described embodiments, as a logic element, a 2-inputs/1-output OR circuit or AND circuit is used. However, an n-inputs/1-output OR circuit or AND circuit may be used, where and n is 3 or more and a natural number).

The "power system" may be a circuit other than the inverter, for example, DC-DC converter.

The output circuits 21 and 25 of the magnetic couplers M shown in FIGS. 4 and 9 are configured of push-pull type and output High state (power source voltage) or Low state (ground voltage) voltage. However, this configuration can be changed to an open-drain output.

As an isolation element, a charge-coupled type isolation element may be used.

What is claimed is:
1. A signal transmission circuit transmitting abnormality signals from a primary side circuit to a secondary side circuit, comprising:
a plurality of isolation elements that electrically isolate the primary side circuit and the secondary side circuit, and allows the abnormality signals to be transmitted therethrough, the primary side circuit including a plurality of switching elements and a plurality of drive circuits that drive the switching elements, the drive circuits each being isolated from each other, the secondary circuit including a receiving unit that receives the abnormality signals corresponding to respective switching elements, transmitted from the primary side circuit; and a logic circuit that receives the abnormality signals from the isolation elements, the logic circuit being disposed in the secondary circuit, outputting a predetermined signal indicating an occurrence of an abnormality when at least one of the switching elements shows the abnormality, wherein:

the isolation elements transmit the abnormality signals relative to a predetermined reference voltage in the secondary side circuit, the predetermined signal outputted by the logic circuit is received by the receiving unit, the logic circuit has a plurality of logic elements, the plurality of logic elements includes one or more first logic elements, each of the first logic element receives an output of a corresponding one isolation element, and an output of an adjacent one logic element, the first logic element includes a second logic element of which the output is received by the receiving unit, the plurality of logic elements includes a third logic element that receives outputs of two corresponding isolation elements, the plurality of logic elements include a fourth logic element, the first logic element is provided with a corresponding isolation element to form a first module, a first isolation element among two isolation elements corresponding to the third logic element and the third logic element are formed in a second module, a second isolation element and the fourth logic element are formed in a third module, and the fourth logic element passes an output of the second isolation element to the third logic element without any changes.

2. The signal transmission circuit according to claim 1, wherein the second logic element in the plurality of logic elements has a shortest distance between a corresponding isolation element and the receiving unit.

3. The signal transmission circuit according to claim 1, wherein:

inputs of the logic circuit are pulled-down or pulled-up, and the logic circuit outputs the predetermined signal indicating an occurrence of an abnormality, when an open failure occurs in a connection between the isolation element and the logic element, or a connection between the logic elements.

4. The signal transmission circuit according to claim 1, wherein inputs of the logic circuit are pulled-down or pulled-up; and the logic circuit outputs the predetermined signal indicating an occurrence of an abnormality, when an output of the isolation element is stopped.

5. The signal transmission circuit according to claim 1, wherein the isolation elements are configured of magnetically-coupled type isolation elements.

6. The signal transmission circuit according to claim 1, wherein the plurality of switching elements configure an inverter having an upper arm switching elements and a lower arm switching element connected in series between a high voltage side and a low voltage side of the inverter;

the logic circuit includes:

a first logic circuit receiving the abnormality signals from the plurality of isolation elements corresponding to the upper arm switching element, outputting the predetermined signal indicating an occurrence of an abnormality when at least one of the upper arm switching elements shows the abnormality; and a second logic circuit receiving the abnormality signals from the plurality of isolation elements corresponding to the lower arm switching element, outputting the predetermined signal indicating an occurrence of an abnormality when at least one of the lower arm switching elements shows the abnormality, an output of the first logic circuit and an output of the second logic circuit are connected to the receiving unit as an input thereof.

7. A signal transmission circuit transmitting abnormality signals from a primary side circuit to a secondary side circuit, comprising:

a plurality of isolation elements that electrically isolate the primary side circuit and the secondary side circuit, and allows the abnormality signals to be transmitted therethrough, the primary side circuit including a plurality of switching elements and a plurality of drive circuits that drive the switching elements, the drive circuits each being isolated from each other, the secondary circuit including a receiving unit that receives the abnormality signals corresponding to respective switching elements, transmitted from the primary side circuit; and a logic circuit that receives the abnormality signals from the isolation elements, the logic circuit being disposed in the secondary circuit, outputting a predetermined signal indicating an occurrence of an abnormality when at least one of the switching elements shows the abnormality, wherein:

the isolation elements transmit the abnormality signals relative to a predetermined reference voltage in the secondary side circuit, the predetermined signal outputted by the logic circuit is received by the receiving unit, the logic circuit has a plurality of logic elements, the plurality of logic elements includes one or more first logic elements, each of the first logic element receives an output of a corresponding isolation element, and an output of an adjacent logic element, the first logic element includes a second logic element of which the output is received by the receiving unit, the plurality of logic elements includes a third logic element that receives outputs of two corresponding isolation elements, and a fourth logic element that receives an output of the corresponding isolation element and an output of the second logic element, the receiving unit serves as a control unit outputting a drive command signal that commands the drive circuits to drive the switching elements, the isolation elements transmit the drive command signal to a corresponding drive circuit from the control unit, and the isolation elements stop transmitting, in response to an output of a corresponding logic element, a drive command signal to a corresponding drive circuit from the control unit.

8. The signal transmission circuit according to claim 7, wherein each of the logic elements and the corresponding isolation element are formed in a module.

* * * * *